(12) United States Patent
Wegmann et al.

(10) Patent No.: US 7,352,452 B2
(45) Date of Patent: Apr. 1, 2008

(54) METHOD AND APPARATUS FOR SETTING OPTICAL IMAGING PROPERTIES BY MEANS OF RADIATION TREATMENT

(75) Inventors: Ulrich Wegmann, Koenigsbronn (DE); Eric Eva, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 14 days.

(21) Appl. No.: 11/228,286

(22) Filed: Sep. 19, 2005

(65) Prior Publication Data

US 2006/0118703 A1 Jun. 8, 2006

(30) Foreign Application Priority Data

Sep. 21, 2004 (DE) .................. 10 2004 046 542

(51) Int. Cl.
*G01B 9/00* (2006.01)
(52) U.S. Cl. ...................................... 356/124; 356/128
(58) Field of Classification Search ................. 356/124
See application file for complete search history.

(56) References Cited

U.S. PATENT DOCUMENTS

| | | | |
|---|---|---|---|
| 6,205,818 B1 | 3/2001 | Seward, III | |
| 6,255,619 B1* | 7/2001 | Jitsuno et al. | 219/121.62 |
| 6,268,903 B1* | 7/2001 | Chiba et al. | 355/53 |
| 2002/0060781 A1 | 5/2002 | Shimizu et al. | |

FOREIGN PATENT DOCUMENTS

| | | |
|---|---|---|
| DE | 101 40 208 A1 | 3/2003 |
| EP | 0 823 662 A2 | 2/1998 |

* cited by examiner

*Primary Examiner*—Roy M Punnoose
(74) *Attorney, Agent, or Firm*—Sughrue Mion, PLLC

(57) ABSTRACT

Method and apparatus for setting optical imaging properties using radiation treatment, specifically a method and an apparatus for setting the imaging properties of an optical system with radiation treatment of at least one optical element of the optical system in the installed state, and a method for setting the imaging properties of an internal optical element with radiation treatment. A measurement is carried out on the optical system in order to determine one or more aberrations in a spatially resolved fashion, a correction that changes the shape and/or refractive index of the internal optical element is calculated in order to reduce the measured aberration or aberrations, and the optical element is irradiated with the aid of a processing radiation that changes the shape and/or refractive index, in accordance with the calculated correction. In addition, a radiation treatment of an optical element for setting its imaging properties uses a compacting processing radiation with the aid of which the optical element is irradiated in a controlled fashion in such a way that its imaging properties are influenced in a controlled fashion via spatially resolved material shrinkage and/or increase of the refractive index. The method and apparatus are suited, for example, for producing correction aspherics in microlithography projection objectives in the installed state.

21 Claims, 2 Drawing Sheets

METHOD AND APPARATUS FOR SETTING OPTICAL IMAGING PROPERTIES BY MEANS OF RADIATION TREATMENT

The following disclosure is based on German Patent Application No. 10 2004 046 542.8 filed on Sep. 21, 2004, which is incorporated into this application by reference.

BACKGROUND OF THE INVENTION

1. Field of the Invention

The invention relates to a method and an apparatus for setting the imaging properties of an optical system with radiation treatment of at least one internal optical element of the optical system in the installed state, and to a method for setting the imaging properties of an internal optical element with radiation treatment.

2. Description of Related Art

U.S. Pat. No. 6,255,619 B1 describes a method and an apparatus for material-removing radiation treatment of an exit surface of a semiconductor laser element, or of a light exit lens of a semiconductor laser element, or of another light source, in the case of which the shape of the wavefront of radiation that exits from the exit surface to be treated is detected by a wavefront measuring apparatus. A control unit infers the shape profile of the treated exit surface from the measured shape of the wavefront and compares the actual shape profile thus determined with a desired shape profile that can be prescribed in order to achieve desired imaging properties, and drives a pulsed UV processing laser as a function thereof. The processing radiation delivered by said laser is directed by a beam splitter mirror onto the exit surface in order to produce the desired shape profile there by material removal, and thus to obtain the desired imaging properties. The control unit can set the position of the beam splitter mirror such that the processing radiation can be directed onto respectively desired surface regions of the light exit surface to be treated, and in the reverse direction passes the radiation emerging from the treated exit surface to the wavefront measuring apparatus.

An important application of the invention is imaging systems for microlithography, which must have a high imaging quality in order to fulfill the requirements placed on them. It is frequently expedient in this case also to make use of aspheric surfaces or elements, briefly denoted as asperics. For a projection objective of a lithography machine, it is known from U.S. Pat. No. 6,268,903 B1 to arrange an optical distortion correction element upstream of the objective, the correction element firstly being placed upstream of the objective and a distortion measurement being carried out in order subsequently to calculate therefrom a correcting, aspheric desired shape of the surface for the correction element, to remove the correction element from the beam path and process it correspondingly by removing material, and then to position it again upstream of the objective.

For a projection exposure machine, it is proposed in the laid-open specification EP 0 823 662 A2 to irradiate a correction radiation during an exposure operation in addition to the exposure radiation, doing so in such a way as to suppress and/or compensate as far as possible a nonuniform temperature distribution, caused by the exposure radiation, of optical elements of a projection objective and a variation, associated therewith, in the imaging properties of the respective optical element owing to the influence of the correction radiation. Further proposed in the laid-open specification DE 101 40 208 A1 is a correction radiation device with the aid of which such a correction radiation can be guided in a scanning fashion over a defined surface region of the relevant optical element.

U.S. Pat. No. 6,205,818 B1 discloses a method for precompacting optical elements made from fused quartz in order to protect against damage by laser radiation a region of the optical element used during operation, that is to say transirradiated. This precompacting can comprise, for example, an irradiation with pulsed laser radiation having a higher pulse flux and/or shorter wavelength than during operation, an irradiation with a high-energy electron beam, or a hot isostatic pressing in order, for example, to raise the density of the optical element by 10 ppm to 3%.

Laid-open specification US 2002/0060781 A1 describes a method for aberration correction of an optical system that makes use of an aberration compensation layer that can be set by irradiation and is attached to an optical element of the optical system. Before or after attaching this compensation layer, the aberration to be corrected is determined in order then as a function thereof to irradiate the compensation layer for the purpose of changing its refractive index, doing so in such a way that the aberration is compensated. Such compensation layers typically comprise special compositions of a polymer matrix with a polymerizable compound that modulates the refractive index. Before, during and/or after the radiation treatment of the compensation layer, the aberrations can be measured by means of a diagnostic system that includes an interferometric wavefront measurement apparatus, for example of the Shack-Hartmann type. After the aberration measurement, a typical method cycle includes the determination of the required intensity profile for the compensation layer for the correction of the measured aberrations, the placing of the required intensity profile on a static mask or a programmable mask generator, a control mode of a calibration camera for the correction of the mask with the aim of compensating aberrations in a projection optics and nonuniformities of a light source, the irradiation of the compensation layer for a prescribed time period with the aid of a suitable wavelength, intensity and spatial distribution of the radiation, and a renewed measurement of the aberrations of the optical system after a certain waiting time. If necessary, this method cycle can be repeated until success of the correction lies within desired limits.

SUMMARY OF THE INVENTION

It is an object of the invention to provide a method and an apparatus with the aid of which it is possible to set the imaging properties of an optical system or an optical element with comparatively little outlay and a desired accuracy by radiation treatment of an optical element, preferably without the need in the case of an optical element installed in a system to have to remove said element for this purpose.

The invention achieves this object according to a first aspect by providing a method for setting the imaging properties of an optical system, in particular a microlithography projection objective, with radiation treatment of at least one internal optical element of the optical system in the installed state, including:

a) carrying out a measurement of the optical system for quantitative, spatially resolved determination of one or more aberrations, b) calculating a correction that changes the shape and/or refractive index of the internal optical element in order to reduce the measured aberration or aberrations for the optical system, and c) irradiating the optical element with the aid of a processing radiation that changes the shape and/or refractive index, in accordance with the calculated correction.

The invention further achieves this object according to a second aspect by providing an apparatus for setting the imaging properties of an optical system with radiation treatment of at least one internal optical element of the optical system in the installed state, having a measuring apparatus carrying out a measurement of the optical system for spatially resolved determination of one or more aberrations for a prescribed location of the beam path in the optical system, a processing radiation unit irradiating the optical element for carrying out the radiation treatment thereof, and a control unit that calculates a correction that changes the shape and/or refractive index of the internal optical element in order to reduce the measured aberration or aberrations, and that drives the processing radiation unit as a function of the calculated correction. This method can in particular be used to irradiate the optical element with the aid of a processing radiation that changes the shape and/or refractive index, in accordance with the calculated correction.

In a further aspect the invention provides a method for setting the imaging properties of an optical element via radiation treatment, wherein the optical element is irradiated, under the control of a compacting processing radiation, in such a way that its imaging properties are influenced in a controlled fashion by spatially resolved material shrinkage and/or increase of the refractive index.

In the first aspect, the invention comprises a method in which the imaging properties of an optical system are set by radiation treatment of at least one internal optical element of said system in the installed state of the optical element. For this purpose, an aberration measurement of the optical system is carried out, for example a special wavefront measurement, with the aid of which the actual shape of the wavefront is determined in a spatially resolved fashion. Suitable for such a wavefront measurement is, for example, a lateral shearing interferometry technique with the aid of which interferograms are produced and there are determined therefrom wavefront derivatives with the aid of which the wavefront profile can be reconstructed.

On the basis of the measured aberration or aberrations, a correction which changes the shape and/or refractive index of the internal optical element is subsequently calculated in a spatially resolved fashion, for which purpose, for example, the measured actual shape of the wavefront is compared with a prescribed shape of the wavefront, preferably a desired shape that results in the case of missing or minimal aberrations. The optical element is then correspondingly irradiated with a radiation that locally effects the calculated change in shape and/or change in refractive index. Owing to the spatially resolved change in shape and/or refractive index of the optical element in selected subregions or over the entire aperture of the optical element, it is possible to set the imaging properties of said optical element, and thereby those of the optical system in a desired way. As mentioned, there is no need for this purpose to remove the optical element, that is to say the imaging properties can be set in situ by this correction method with a comparatively low outlay. The designation of internal optical element in this case includes any internal optical component or optically active surface between a light entry surface and a light exit surface of the relevant optical system, including the inwardly facing surfaces of an entry-side and an exit-side optical component of the optical system.

In an advantageous development of this method, the steps of the wavefront measurement, the calculation of the correction of the optical element and the corresponding irradiation of the optical element are repeated until the difference between the actual and desired shape of the wavefront fulfills a prescribed qualitative criterion, that is to say the measured actual shape of the wavefront has reached the desired shape with sufficient prescribed accuracy.

In a further refinement of the invention, the optical element is located in or near a pupil plane of the optical system. This has in general the advantage that the correction calculation is comparatively simple for this position of the optical element. The optical element to be treated can also be located between a pupil plane and a first surface, on the entry side, of the optical system, or between a pupil plane and a last surface, on the exit side, of the optical system.

In advantageous refinements of the invention, the optical system is an optical imaging system of a microlithography projection exposure machine, and/or use is made for the wavefront measurement of a lateral shearing interferometry technique at the operating wavelength, that is to say with measurement radiation of the same wavelength as a radiation used during operation of the optical system. This permits a wavefront correction, for example of a projection objective of the machine, in situ with the use of an associated illumination system that also provides the exposure radiation.

The apparatus according to the invention is suitable for carrying out this method and includes for this purpose a suitable measuring apparatus, a unit for providing the processing radiation, and a control unit for the correction calculation as well as for driving the processing radiation unit in accordance with the calculated correction.

In an advantageous development, the processing radiation unit has a deflecting mirror that can be moved in a rotary and/or translatory fashion and can be positioned in the beam path between an object-side part, positioned upstream of the optical system, of the wavefront measuring apparatus and the optical system, or between the optical system and a part, positioned downstream thereof, of the wavefront measuring apparatus. Owing to the mobility of the deflecting mirror, the processing beam can be kept smaller than the region of the optical element to be treated, and can be guided over said region in a desired way.

In a further refinement, the processing radiation unit includes a focusing/compensating optics, movable parallel to the beam path of the processing radiation, with the aid of which the processing radiation can be focused in a chromatically compensated fashion onto the optical element in a way adapted to the beam-guiding movement of the deflecting mirror.

In a further aspect, the invention comprises a method for setting the imaging properties of an optical element via a radiation treatment in the case of which said optical element is irradiated, under the control of a compacting processing radiation, in such a way that its imaging properties are influenced in a controlled fashion by spatially resolved material shrinkage and/or increase of the refractive index. It is possible thereby, for example, to produce so-called nanoaspherics, that is to say aspherics with deviations from the spherical shape in the region below 1 µm, as also any other desired local changes in the optical path length in optical elements typically in the nanometer region below 1 µm for the purpose of achieving desired imaging properties.

In a development of this method, the optical element is irradiated over its entire surface with the processing radiation, there being arranged upstream a filter with the aid of which a desired energy density profile can be set in a spatially resolved fashion such that the processing radiation is incident at each point of the region of the optical element to be treated with an energy density suitable for achieving the material shrinkage and/or increase of the refractive index locally required there. This setting of a desired energy density profile can be supported by selecting a correspondingly designed expansion optics that expands the processing beam supplied by a corresponding radiation source to an extent desired.

In a further refinement of the method, the optical element is arranged such that it can rotate. This fact can be used for the purpose of producing rotationally symmetrical effects with regard to material shrinkage and/or increase of the refractive index without the need for this purpose for the processing radiation to have a corresponding rotationally symmetrical energy density profile.

In a development of the method that is an alternative to the irradiation over the entire surface, the beam spot of the processing radiation that is incident on the optical element is selected to be smaller than the region of the optical element to be irradiated, a relative movement of optical element and beam spot then additionally being provided, be this by active movement only of the optical element or only of the beam spot, or both of the optical element and of the beam spot.

In a further refinement, a rotationally symmetrical processing beam having a spatially dependent Gaussian intensity profile is selected for the beam spot. Such a "soft" intensity profile without excessively abrupt changes in intensity avoids the occurrence of excess mechanical stresses in the optical element during the irradiation.

The method for setting the imaging properties of an optical element by radiation treatment causing material shrinkage and/or increasing the refractive index can be used, in particular, in the method for setting the imaging properties of an optical system in order to irradiate the relevant optical system element in its installed state in a fashion that correspondingly has the effect of changing shape and/or changing refractive index.

BRIEF DESCRIPTION OF THE DRAWINGS

Advantageous embodiments of the invention are illustrated in the drawings and described below. In the drawings.

DETAILED DESCRIPTION OF THE PREFERRED EMBODIMENTS

Figure 1:
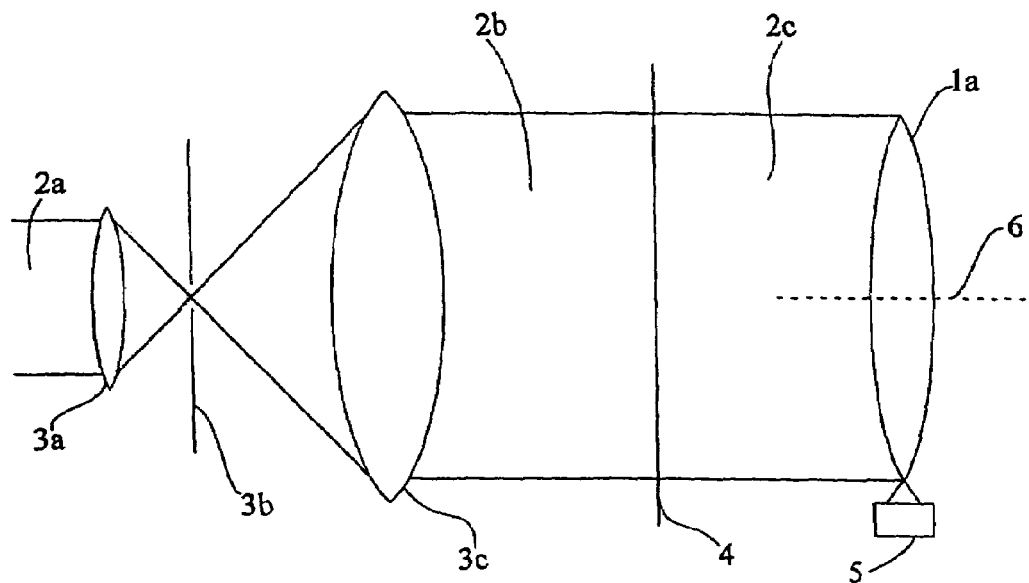
FIG. 1 shows a schematic sectional view of a setup for irradiating the entire surface of an optical element with a compacting processing radiation for setting its imaging properties.
Figure 2:
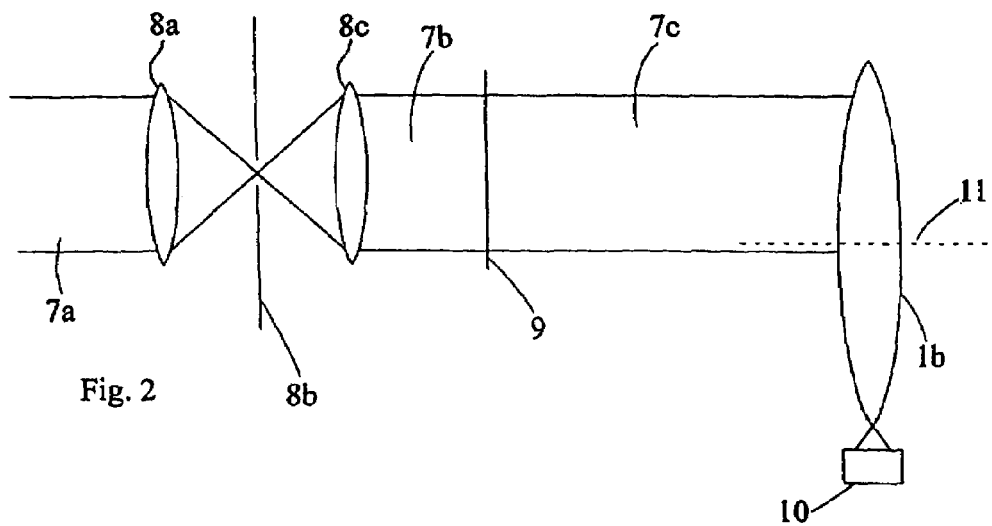
FIG. 2 shows a schematic sectional view corresponding to FIG. 1 for the case of not irradiating the entire surface of the optical element to be treated.

FIGS. 1 and 2 illustrate two examples of a method for fine setting of the imaging properties of an optical lens $1a$, $1b$ or of another optical element using a special radiation treatment with a compacting processing radiation. The two variant methods differ from one another in that in the case of FIG. 1 the entire surface of the lens $1a$ is irradiated, while in the case of FIG. 2 the lens $1b$ is irradiated with a beam cross section that is smaller than the cross section of the lens region to be treated. Two method variants are suitable, in particular, for correcting aberrations of these lenses $1a$, $1b$ themselves or of an optical system in which these lenses $1a$, $1b$ are or will be installed, that remain after a customary production process including polishing operations for achieving a desired shape of the lens surface.

Thus, for example, use is frequently made in imaging systems of microlithography projection exposure machines and, in particular, in their projection objectives of so-called design aspherics, that is to say specially designed aspheric lenses, in order to be able to correct aberrations of these imaging systems without the use of numerous spherical lenses. Aspherics produced with the aid of conventional polishing methods exhibit an aspherization, that is to say a degree of deviation from the spherical shape, of typically a number of micrometers. For the purpose of correcting higher-order aberrations, in particular, there is a need for so-called nanoaspherics whose aspherization is typically less than 100 nm. It is not possible using conventional polishing methods to produce these immediately with the desired throughput and desired accuracy. The method illustrated in FIGS. 1 and 2 is attended by evident advantages precisely for this application as well, that is to say it is possible thereby to produce nanoaspherics with a comparatively low outlay and high accuracy.

The compacting processing radiation used is preferably one of the same or shorter wavelength as for that radiation which is used in normal operation of the finished lens $1a$, $1b$. The compacting processing radiation leads to a shrinkage of the material of the lens $1a$, $1b$, such as fused quartz, and to an increase in the refractive index thereof, the last-named effect generally clearly predominates with regard to the contribution of the wavefront correction or aberration correction. The relative change in density of the irradiated material rises with growing energy density and number of pulses of the pulsed laser processing radiation. With suitable values of energy density and number of pulses, it is possible to achieve a relatively high degree of compaction in a comparatively short time. If only a part of the sample, that is to say only a partial volume of the lens $1a$, $1b$, is irradiated, the nonirradiated region resists the material shrinkage such that the latter turns out to be comparatively less. If the irradiated region is a few square centimeters in size, there is a significant difference to be noted between homogeneous, irradiation over the entire surface and partial irradiation in a subregion in the edge region at best. Mechanical stresses and a strain birefringence effect induced thereby can very largely be avoided even in the edge region when the whole amplitude of the compacting irradiation energy density takes place not over a short length of only a few millimeters, but over a suitably larger length.

As may be seen from FIG. 1, for the case illustrated there of irradiation of lens $1a$ over its entire surface a laser radiation $2a$ for example having a wavelength of 248 nm or 193 nm, supplied by a pulsed laser source, for example a high-power excimer laser, is expanded by a telescope optics with an entry-side lens $3a$, spatial filter $3b$ and exit-side lens $3c$ to form a beam $2b$ whose cross section corresponds to the optically free cross section of the lens $1a$ to be treated. A desired energy density profile is set with the aid of a subsequent filter 4, that is to say the filter 3 is designed for a precalculated spatially dependent transmittance that is determined as a function of the spatial coordinates of the filter plane. The filter 4 can be, for example, an individually calculated, exchangeable gray filter produced from $TaBO_4$ by a vapor deposition process and having a locally varying transmittance. The spatial dependence of the transmittance of the filter 4 is calculated such that the filter 4 produces from the incoming, expanded laser beam 2b a compacting processing beam 2c that has the desired spatially dependent energy density profile, with which the lens 1a is treated in a compacting fashion. The outcome of this is to effect in a spatially resolved fashion over the entire effective cross section of the lens 1a a material shrinkage precalculated, for example, for the purpose of correcting aberrations, and an increase in refractive index, in order to set in the desired way the imaging properties of the lens 1a and thus, where appropriate, an optical system in which it is used.

In a practical example of application, in the case of which the expanded compacting processing beam 2c has a diameter of approximately 127 mm, the lens 1a can be precompacted homogeneously within one or a few days by approximately 0.65 ppm, the induced absorption and the consumption of hydrogen in the lens material remaining insignificant. Referred to typical lens thicknesses in the region of approximately 5 cm, this corresponds to a first approximation to a change in the optical path length of 32.5 nm for a wavelength of 633 nm, something which is frequently already more than sufficient for many applications in the field of nanoaspherics and correction aspherics in the micrometer region. The effect is even yet somewhat stronger in the case of the usually shorter useful wavelength of the radiation used during operation of the lens 1a. In normal useful operation, the lens 1a is compacted in a way similar to conventional lenses not pretreated in this way, but not so strongly.

The expansion optics 3a, 3b, 3c can optionally be designed so as already to provide a rough spatially dependent energy density profile for the expanded beam 2b such that the filter 4 needs to be designed only for the fine setting of the energy density profile, the result being that not so much energy is absorbed, and therefore destroyed, in the filter 4.

In cases where the processing beam 2c is intended to have a rotationally symmetrical compacting effect on the lens 1a, it can be provided to design a holder 5 of the lens 1a in such a way that the lens 1a can be rotated about its optical axis 6 during the compacting radiation treatment. There is then no need for such high requirements with regard to rotationally symmetrical field illumination for the beam expansion optics 3a, 3b, 3c.

In the example of FIG. 2, a pulsed laser beam 7a of the same type as the laser beam 2a of FIG. 1 is transformed via an optics composed of an entry-side lens 8a, spatial filter 8b and exit-side lens 8c into a beam 7b that is subsequently transformed by a correction filter 9 into a rotationally symmetrical processing beam 7c with a sufficiently "soft" intensity profile, that is to say whose intensity profile in the plane perpendicular to the beam direction is smooth to a prescribable extent, without the appearance of abrupt changes in intensity to a short length. For example, a Gaussian distribution of the intensity profile over the beam cross section of the treatment beam 7c is suitable. The diameter of the compacting treatment or processing beam 7c directed to the lens 1b is sufficiently small for the purpose of good spatial resolution, and is selected such that any stresses in the edge region of an aperture of the lens 1b are still tolerable, for example in the region from approximately 1 cm to approximately 2 cm. For the sake of greater ease of recognition, the diameter of the processing beam 7c is illustrated in FIG. 2 in a greatly exaggerated way by comparison with the diameter of the lens 1b.

The compacting treatment of the lens 1b then includes a local, selective irradiation of the lens 1b with the beam spot of the compacting processing radiation 7c, the beam spot being guided over the lens region to be irradiated, and a respectively suitable irradiation intensity being set. In this example, the lens 1b is kept for this scanning on an xy displacement table 10 by means of which it can be moved appropriately in the xy plane perpendicular to the beam direction and its optical axis 11.

Thereby, by analogy with the example of FIG. 1, the refractive index profile and/or the dimensions, that is to say the surface shape profile, of the lens 1b can be influenced as desired in a spatially dependent way by the effect of the material shrinkage and, chiefly, of the increase in refractive index, and thereby corrected in order to change the imaging properties of the lens 1b or of an optical system in which it is used in a prescribable way.

Specifically suitable are the method variants illustrated in FIGS. 1 and 2 for producing nanoaspherics or correction aspherics that are installed in a microlithography projection objective as an inner lens element, an entry-side lens element or an exit-side lens element. In this and also all other possible applications, the required individual correction of the lens or of another optical element to be treated is determined in advance by a suitable numerical simulation, for example using a finite element technique, on the basis of the nonlinear law of compaction and the complex relationship between irradiated and nonirradiated regions as well as changes in refractive index and dimension.

The method of fine setting of the imaging properties of an optical element via a defined, spatially resolved precompacting radiation treatment has the advantage that it is completely free from contamination, that it is comparatively quick and cost-effective for individual corrections, in particular, permits good spatial resolution and adjustment owing to an optical system, and that, in addition, it is possible to process in a mount, that is to say after the appropriate optical element has been installed in a mount, and, if appropriate, with a layer, that is to say it is already possible to apply a correction layer before the compacting treatment. It emerges that given suitable selection of the precompaction parameters, in particular of the radiation energy density, the precompaction effect on the setting of the imaging properties remains stable, that is to say no disturbing significant relaxation occurs.

Figure 3:
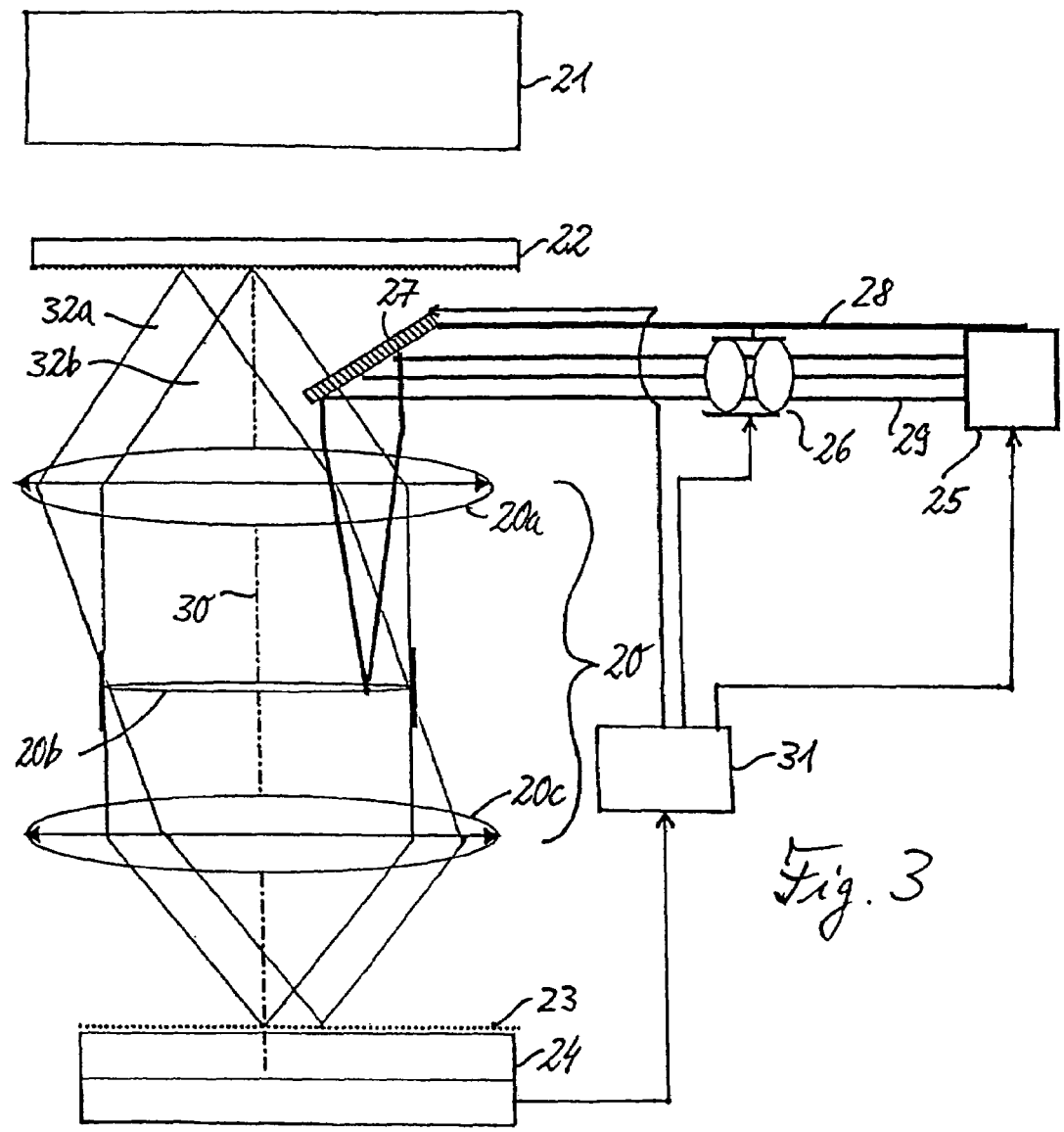
FIG. 3 shows a schematic sectional view of a microlithography projection objective with an assigned apparatus for setting its imaging properties.

FIG. 3 schematically illustrates an in-situ wavefront correction for a projection objective 20 which can, in particular, be one for a microlithography projection exposure machine, and of which for the sake of clarity there are shown by way of representation only an entry-side lens 20a, a correction aspherics 20b and an exit-side lens 20c. Assigned to the objective 20 are a wavefront measuring device and a processing radiation unit that, in the case of a microlithography projection exposure machine, are installed in the latter or can be positioned there, for example, such that the objective 20 need not be removed for the in-situ wavefront correction.

The wavefront measuring device operates according to the principle of lateral shearing interferometry and is preferably designed as a so-called operational interferometer (OI) that operates with measuring radiation of the same wavelength as an exposure radiation used in normal exposure operation. For this purpose, the OI typically uses an illumination system 21, also used for normal exposure operation, to produce the measuring radiation. On the object side, that is to say on the object side of the projection objective 20, the OI has a suitable wavefront source, typically a measuring reticle 22, to be positioned in a reticle plane of the exposure machine, with a wavefront-producing coherence mask pattern. On the image side, that is to say on the image side of the objective 20, the OI includes a diffraction grating 23, typically positioned in or near the image plane of the objective 20, and a downstream detection part 24, for example in the form of a CCD camera with a front CCD array. As compact OI, in the variant shown in FIG. 3, the detector 24 with the CCD array is connected to the diffraction grating 23 at a slight spacing. Alternatively, the shearing interferograms produced by the diffraction grating 23 can be projected via an interposed imaging optics onto the CCD array of a detector that then follows at a correspondingly larger spacing. The setup and properties of such wavefront measuring devices are known per se, for example from appropriate earlier patent applications of the applicant relating to this topic, to which reference is made for further details, and therefore require no further explanation here. All that remains to be mentioned here is that this type of wavefront measuring device is used to determine from the shearing interferograms wavefront derivatives that permit reconstruction of the wavefront profile for example in the pupil plane of the objective 20, that is to say it is possible to detect the wavefront profile in the interior of the objective 20 at this point at which the correction aspherics 20*b* is located.

The processing radiation unit comprises a laser source 25, a focusing and compensating optics 26 and a deflecting mirror 27 that are connected to a holder 28 shown only schematically. Pulsed laser radiation 29 emitted by the laser source 25 passes via the focusing and compensating optics 26 to the deflecting mirror 27 and is focused from there onto the correction aspherics 20*b* via the one or more components 20*a*, upstream of the correction aspherics 20*b*, of the objective 20. For this purpose, the deflecting mirror 27 is introduced into the region between the measuring reticle 22 and the objective 20.

By means of the pulsed laser radiation irradiated by the processing radiation unit 25, 26, 27, the correction aspherics 20*b* is treated in a fashion that changes the shape, in particular by material removal and/or material shrinkage, and/or in a fashion that changes the refractive index, in particular raises the refractive index, specifically in a spatially resolved fashion in such a way that imaging properties desirable for the objective 20 are set overall, preferably so as to minimize aberrations. For this purpose, the processing laser beam 29 is guided in a scanning fashion over the aperture of the correction aspherics 20*b*. This can be performed in various ways.

One possibility consists in arranging the deflecting mirror 27 such that it can be moved in a translatory fashion in two directions of the xy plane perpendicular to the optical axis 30 of the objective 20, the focusing and compensating optics 26 and the laser source 25 also being moved if required by moving the holder 28 as a whole, or by arranging only the deflecting mirror 27 on the holder 28 in a correspondingly relatively movable fashion. Alternatively, in order to deflect the beam in one of the two directions it is possible to provide a corresponding rotation of the deflecting mirror 27 that is then arranged for this purpose on the holder 28 such that it can rotate suitably. A further possibility consists in arranging the deflecting mirror 27 such that it can be tilted in two, preferably mutually perpendicular, directions in order to use these tilting movements to guide the processing beam 29 in two dimensions over the correction aspherics 20*b*. The focusing and compensating optics 26 is suitably tracked in each case so that during the scanning movement the processing beam 29 remains focused on the correction aspherics 20*b*, and chromatic distortions are compensated. For this purpose, this optics 26 is arranged on the holder 28 such that it can be moved in a translatory fashion parallel to the beam direction.

A control unit 31 drives the individual components of the processing radiation unit 25, 26, 27 in a suitable fashion in order to execute the outlined scanning movement of the processing beam 29 over the correction aspherics 20*b* and to set the suitable treatment parameters, in particular the intensity and pulse frequency of the processing radiation 29, as a function of the measured wavefront profile.

Whereas for the purpose of radiation treatment the correction aspherics 20*b* are conventionally removed from the objective 20 in order to change their imaging properties and thus to set desired imaging properties for said objective, and are then reinstalled after a corrective radiation treatment, in order to determine the imaging behavior of the objective 20 anew, the arrangement indicated permits the desired wavefront correction in situ in conjunction with observation of the current imaging behavior of the objective 20 by means of the wavefront measuring device. Since the processing beam 29 being treated develops its material-influencing action only in the region of its focus at the position of the correction aspherics 20*b*, the one or more upstream objective components 20*a* remain uninfluenced thereby. It is advantageous here when a femtosecond laser is used as radiation source 25, since said laser can be used to avoid or keep to a minimum any material damage of the environment of the correction aspherics 20*b* to be treated, in particular the objective components 20*a*, 20*c* upstream and downstream thereof, owing to heat.

The radiation treatment of the correction aspherics 20*b* is preferably performed by carrying out a prior adjustment process that is undertaken after the setting-up of the illumination system 21 and the projection objective 20 and their installation in the exposure machine. The radiation treatment of the correction aspherics 20*b* constitutes a local fine correction with the aid of which the residual aberrations possibly remaining are minimized. The success of the correction attained is detected at the same time with the wavefront measuring device, which can be used to reconstruct the wavefront profile in the pupil plane of the objective 20 and thus in the positional plane of the correction aspherics 20*b*. The control unit 31 evaluates the shearing interferogram data supplied by the detector 24 by comparing the measured actual shape of the wavefront with a calculated desired shape of the wavefront virtually free from aberrations and using the result of comparison to calculate in a spatially resolved fashion a correction for the correction aspherics that changes shape and/or changes refractive index, and controls the radiation treatment process for the correction aspherics 20*b* so as to effect the calculated correction.

As symbolized by two beam profiles 32*a*, 32*b*, in the example shown in FIG. 3 the wavefront measurement is designed in a multichannel fashion for parallel measurement at a number of field coordinate points. This enables the modifications of the imaging properties of the correction aspherics 20*b* to be controlled even when the deflecting mirror 27 covers a part of the field for the wavefront measurement, as long as it is sufficiently smaller than the objective cross section. Whereas in the example shown the deflecting mirror 27 is arranged in the beam path upstream of the objective 20, it can alternatively be positioned in the beam path in a similar way downstream of the objective 20, in particular between the exit-side objective component 20*c* and the image-side part 23, 24 of the wavefront measuring device. In this case, the processing radiation is consequently directed onto the internal correction aspherics 20b via the exit-side objective component 20c in the direction opposite to the measuring radiation 32a, 32b. The result for this alternative embodiment is the same advantageous effects and properties as are mentioned in relation to the exemplary embodiment of FIG. 3, it being possible in this case for the exit-side objective component 20c to be used instead of the entry-side objective component 20a for the purpose of focusing the processing radiation onto the correction aspherics.

The radiation treatment of the correction aspherics 20b can be, in particular, one that removes material at the surface and/or changes the refractive index, for example on the basis of material shrinkage or material compaction. In particular, the radiation treatment process can be one such as was described in detail above in relation to FIGS. 1 and 2. The position of the correction aspherics 20b, described in relation to the exemplary embodiment of FIG. 3, in or near a pupil plane of the objective 20 has an advantageous effect on the outlay for calculating the correction, required for compensating aberrations, of the correction aspherics 20b, that is to say for this position of the correction aspherics 20b it is possible in general to determine the correction with the aid of a comparatively slight computational outlay. Alternatively, the correction aspherics 20b or, in general, the optical element to be treated, can, however, also be positioned at any other location in the interior of the objective 20 or, in general, of the optical system under consideration, if this is required or useful for the relevant application.

As is made clear by the example of FIG. 3, the invention permits radiation treatment of a correction aspherics and, alternatively, of any other desired optical element for microlithography projection objectives and any other desired optical systems for the purpose of setting specific imaging properties of the treated element and/or of an optical system in which the same is installed, doing so in situ without this requiring its removal from the optical system. It can also be a question here, in particular, of internal system components or optically active surfaces between an entry-side and an exit-side component or surface of the optical system, that is to say the invention is not restricted to external surfaces of an optical system that are to be processed. The result of treatment can be detected directly by an OI or another wavefront measuring device. Where appropriate, the treatment and measuring steps are repeated until the measured shape of the wavefront is sufficiently free from aberrations.

While exemplary embodiments have especially been described above in which wavefront errors are determined and corrected by means of an appropriate wavefront measurement, it is also possible in the same inventive way for other aberrations, for example distortion, to be measured and corrected with a suitably designed measuring device.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

What is claimed is:

1. A method for setting the imaging properties of an optical system with radiation treatment of at least one internal optical element of the optical system in the installed state, comprising:
   a) carrying out a measurement of the optical system for quantitative, spatially resolved determination of one or more aberrations,
   b) calculating a correction that changes at least one of the shape and the refractive index of the internal optical element in the installed state in order to reduce the measured aberration or aberrations for the optical system, and
   c) irradiating the internal optical element in the installed state with the aid of a processing radiation that changes the at least one of the shape and the refractive index, in accordance with the calculated correction.

2. The method as claimed in claim 1, wherein the carrying out of the measurement comprises a wavefront measurement of the optical system for spatially resolved determination of the actual shape of the wavefront, and the calculation of the correction that changes the at least one of the shape and the refractive index of the internal optical element in the installed state is performed in such a way that the measured actual shape of the wavefront for the optical system is matched to a prescribed shape of the wavefront.

3. The method as claimed in claim 2, wherein the steps a to c are repeated until the difference between the measured actual shape of the wavefront and the prescribed shape of the wavefront fulfills a prescribed qualitative criterion.

4. The method as claimed in claim 2, wherein the wavefront measurement is executed with a lateral shearing interferometry technique at the operating wavelength of the optical system.

5. The method as claimed in claim 1, wherein the internal optical element in the installed state to be treated is positioned in or near a pupil plane of the optical system, or between a pupil plane and a first surface, on the entry side, of the optical system, or between a pupil plane and a last surface, on the exit side, of the optical system.

6. The method as claimed in claim 1, wherein the optical system is an optical imaging system of a microlithography projection exposure machine.

7. The method as claimed in claim 1, wherein, in the irradiating step, the optical element is irradiated, under the control of a compacting processing radiation, such that the imaging properties of the optical element are influenced in a controlled fashion by at least one of spatially resolved material shrinkage and increase of the refractive index.

8. The method as claimed in claim 1, wherein the optical system comprises a microlithography projection objective.

9. An apparatus for setting the imaging properties of an optical system with a radiation treatment of at least one internal optical element of the optical system in the installed state, comprising:
   a measuring apparatus carrying out a measurement of the optical system for spatially resolved determination of one or more aberrations for a prescribed location of the beam path in the optical system,
   a processing radiation unit irradiating the internal optical element in the installed state for carrying out the radiation treatment thereof, and
   a control unit that calculates a correction that changes at least one of the shape and the refractive index of the internal optical element in the installed state to reduce the measured aberration or aberrations, and that drives the processing radiation unit as a function of the calculated correction.

10. The apparatus as claimed in claim 9, wherein the measuring apparatus is a wavefront measuring apparatus carrying out a wavefront measurement of the optical system for spatially resolved determination of the actual shape of the wavefront, and the control unit calculates the correction that changes at least one of the shape and the refractive index of the internal optical element in the installed state, such that the measured actual shape of the wavefront is matched to a prescribed shape of the wavefront.

11. The apparatus as claimed in claim 10, wherein the optical system is an optical imaging system of a microlithography projection exposure machine, and the wavefront measuring apparatus is set up for carrying out a lateral shearing interferometry measurement at the operating wavelength of the exposure machine.

12. The apparatus as claimed in claim 9, wherein the processing radiation unit has a deflecting mirror configured to move in at least of a rotary and a translatory fashion and to be positioned between the optical system and a part of the measuring apparatus positioned upstream thereof, or between the optical system and a part of the measuring apparatus positioned downstream thereof.

13. The apparatus as claimed in claim 9, wherein the processing radiation unit has focusing/compensating optics, movable parallel to the beam path of the processing radiation, for chromatically compensated focusing of the processing radiation onto the internal optical element in the installed state.

14. The apparatus as claimed in claim 9, wherein the internal optical element in the installed state forms an internal system component of the optical system.

15. The apparatus as claimed in claim 14, wherein the internal optical element in the installed state is positioned in or near a pupil plane of the optical system.

16. A method comprising:

irradiating an optical element with a compacting processing radiation, such that imaging properties of the optical element are influenced by at least one of spatially resolved material shrinkage and increase of the refractive index; and controlling said irradiating for setting the imaging properties of the optical element.

17. The method as claimed in claim 16, wherein the optical element is irradiated over its entire surface, and a filter is arranged upstream of said optical element for setting a prescribed spatially dependent energy density profile.

18. The method as claimed in claim 17, wherein arranged upstream of the filter is an expansion optics with a defined spatially dependent energy density profile of the radiation output by the expansion optics.

19. The method as claimed in claim 16, wherein the optical element is arranged to rotate about its optical axis.

20. The method as claimed in claim 16, wherein the optical element is irradiated with a beam spot that is smaller than the region of the optical element to be irradiated, and the beam spot and the optical element are moved relative to one another in order to guide the beam spot over the region of the optical element to be irradiated.

21. The method as claimed in claim 20, wherein the optical element is irradiated with a processing beam having a rotationally symmetrical, Gaussian intensity profile.

* * * * *